United States Patent [19]
Goishi et al.

[11] Patent Number: 5,640,539
[45] Date of Patent: Jun. 17, 1997

[54] IC ANALYSIS SYSTEM HAVING CHARGED PARTICLE BEAM APPARATUS FOR IMPROVED CONTRAST IMAGE

[75] Inventors: Akira Goishi, Kazo; Masayuki Kurihara, Gyoda; Koshi Ueda, Tokyo, all of Japan

[73] Assignee: Advantest Corporation, Tokyo, Japan

[21] Appl. No.: 309,750

[22] Filed: Sep. 21, 1994

[30] Foreign Application Priority Data

Sep. 21, 1993 [JP] Japan .................................. 5-257625
Apr. 15, 1994 [JP] Japan .................................. 6-101938

[51] Int. Cl.$^6$ .......................... G06F 17/00; H01J 37/304; G21K 1/08
[52] U.S. Cl. ...................... 395/500; 250/310; 250/492.2; 250/492.22; 371/22.6; 371/27; 382/144; 382/145
[58] Field of Search .................... 395/500; 382/141, 382/144, 145, 147; 364/491; 371/27, 22.3, 22.5, 22.6; 324/158.1, 751; 250/310, 306, 396 R, 397, 398, 492.2, 492.3

[56] References Cited

U.S. PATENT DOCUMENTS

| | | | |
|---|---|---|---|
| 4,807,159 | 2/1989 | Komatsu et al. | 384/524 |
| 4,996,434 | 2/1991 | Tanaka | 250/492.3 |
| 5,004,927 | 4/1991 | Nakagawa | 250/492.2 |
| 5,144,225 | 9/1992 | Talbot et al. | 324/73.1 |
| 5,146,089 | 9/1992 | Rosien | 250/309 |
| 5,210,696 | 5/1993 | Yano | 364/488 |
| 5,287,290 | 2/1994 | Tabara et al. | 364/489 |
| 5,369,282 | 11/1994 | Arai et al. | 250/492.22 |
| 5,376,883 | 12/1994 | Kaito | 324/158.1 |
| 5,393,976 | 2/1995 | Koike | 250/310 |
| 5,481,550 | 1/1996 | Garcia et al. | 371/27 |

*Primary Examiner*—Kevin J. Teska
*Assistant Examiner*—Tan Nguyen
*Attorney, Agent, or Firm*—Knobbe, Martens, Olson & Bear, LLP

[57] ABSTRACT

The object of the invention is to provide an IC analysis system having a charged particle beam apparatus in which the operability and picture quality have been enhanced and the measurement method of a device under test. In the IC analysis system, stop signal generating means in which the stop signal stimulates the acquisition of image data is added to a test pattern generator and acquisition completion signal generating means which releases the stopping state on completing the acquisition of image data and which resumes the test pattern updating operation is added to the charged particle beam apparatus. Furthermore, by adding mode select means to the charged particle beam apparatus, a clearer potential contrast image can be obtained. The methods for locating fault positions can be realized in the IC analysis system having the charged particle beam apparatus wherein the image data can be obtained by alternate test patterns, or by adding one image data to the reverse potential of another image data, or by scanning and irradiating the charged particle beam onto the same surface of the device at a plurality of times.

9 Claims, 15 Drawing Sheets

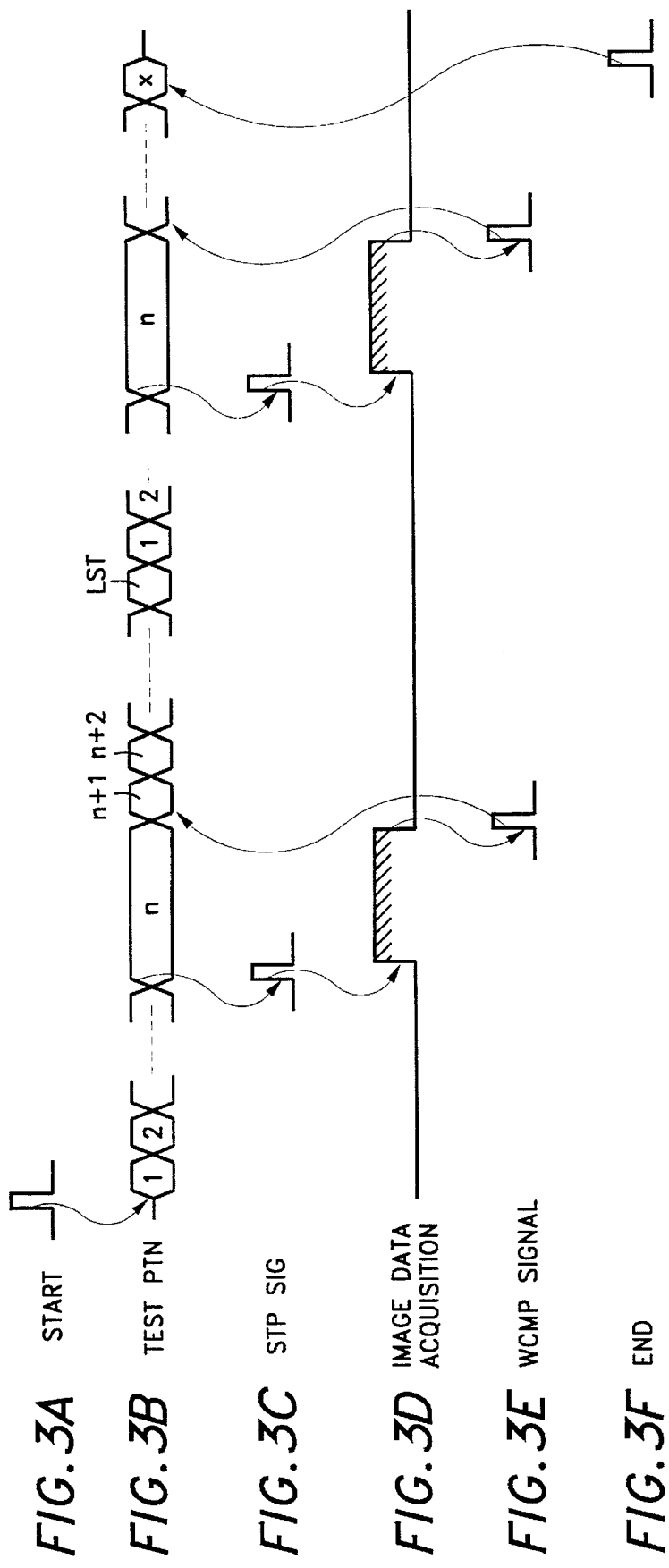

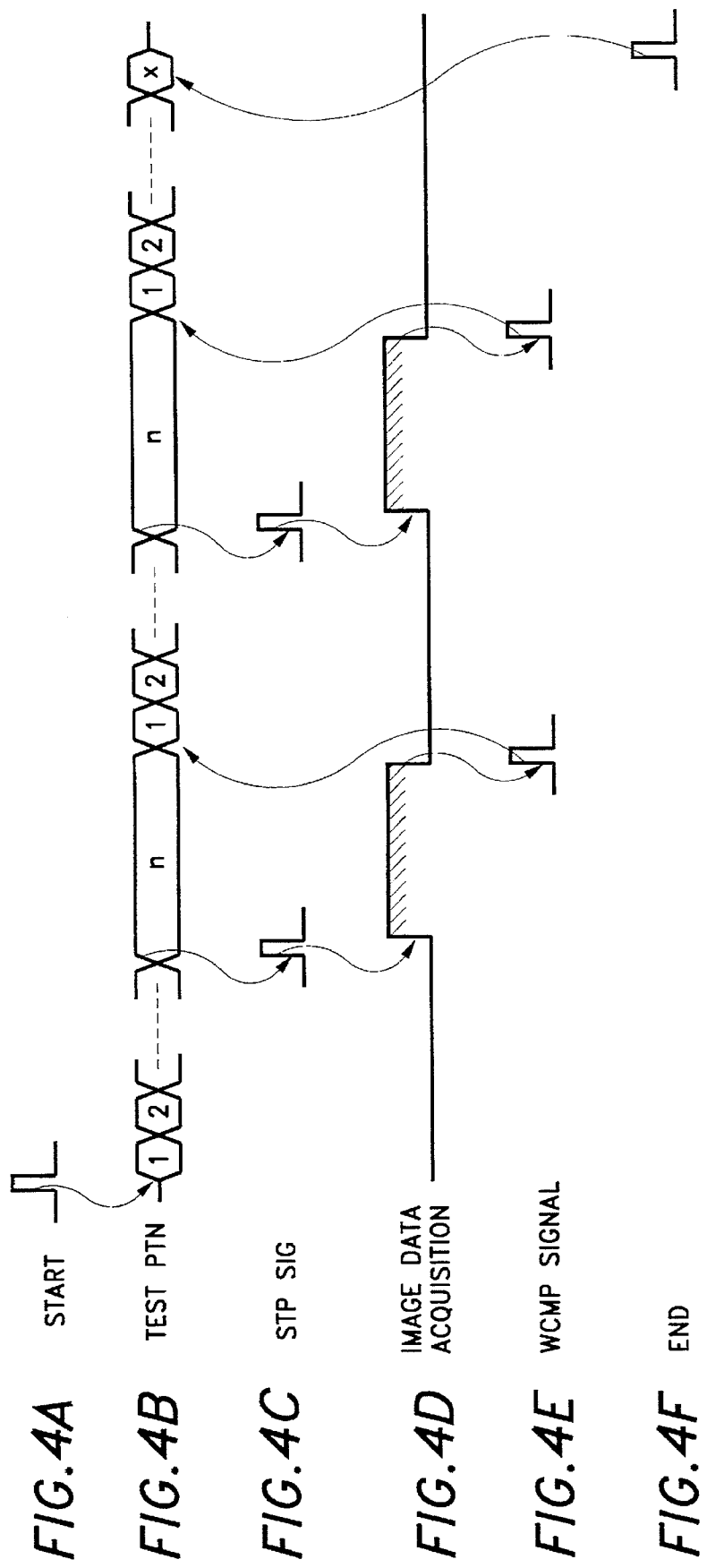

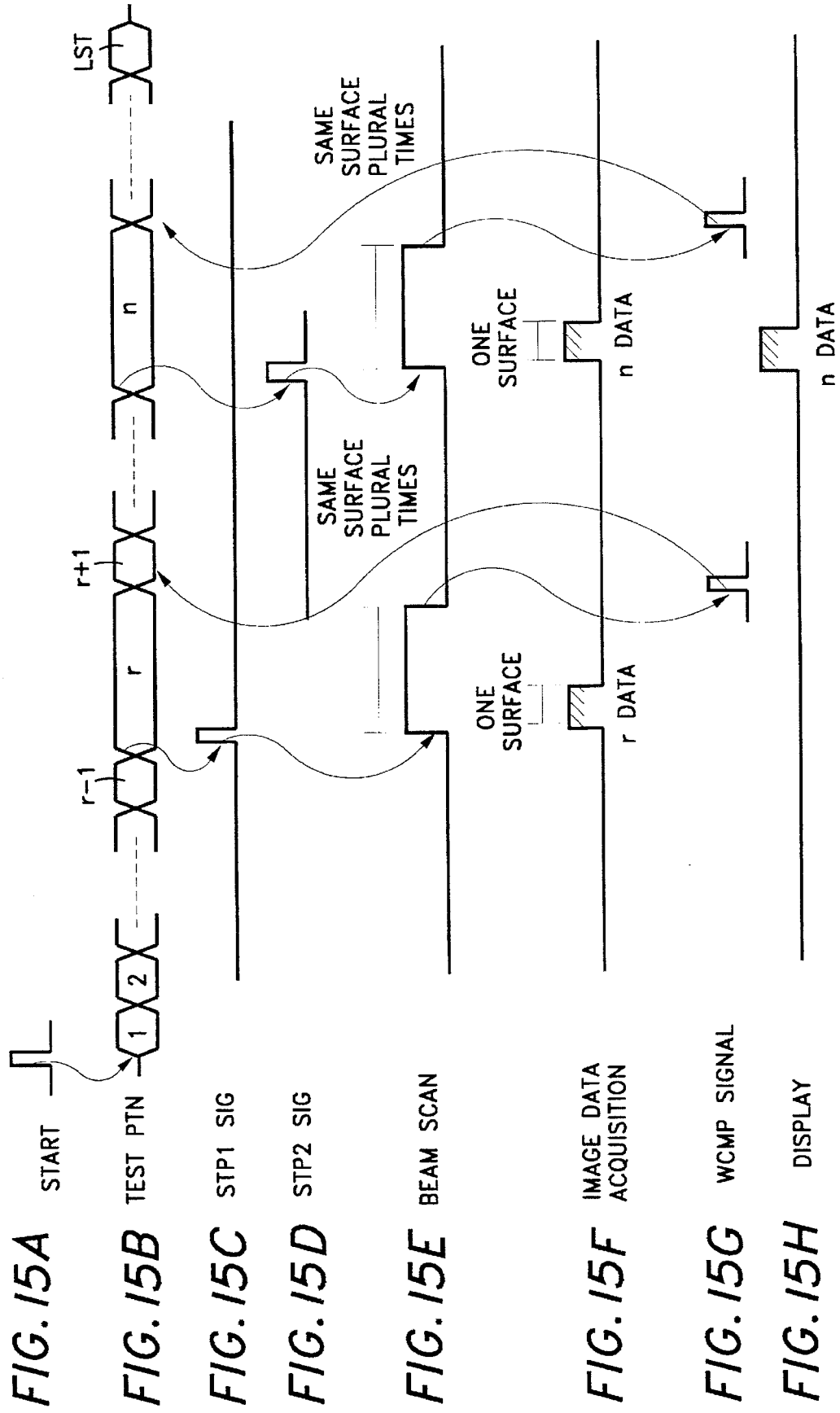

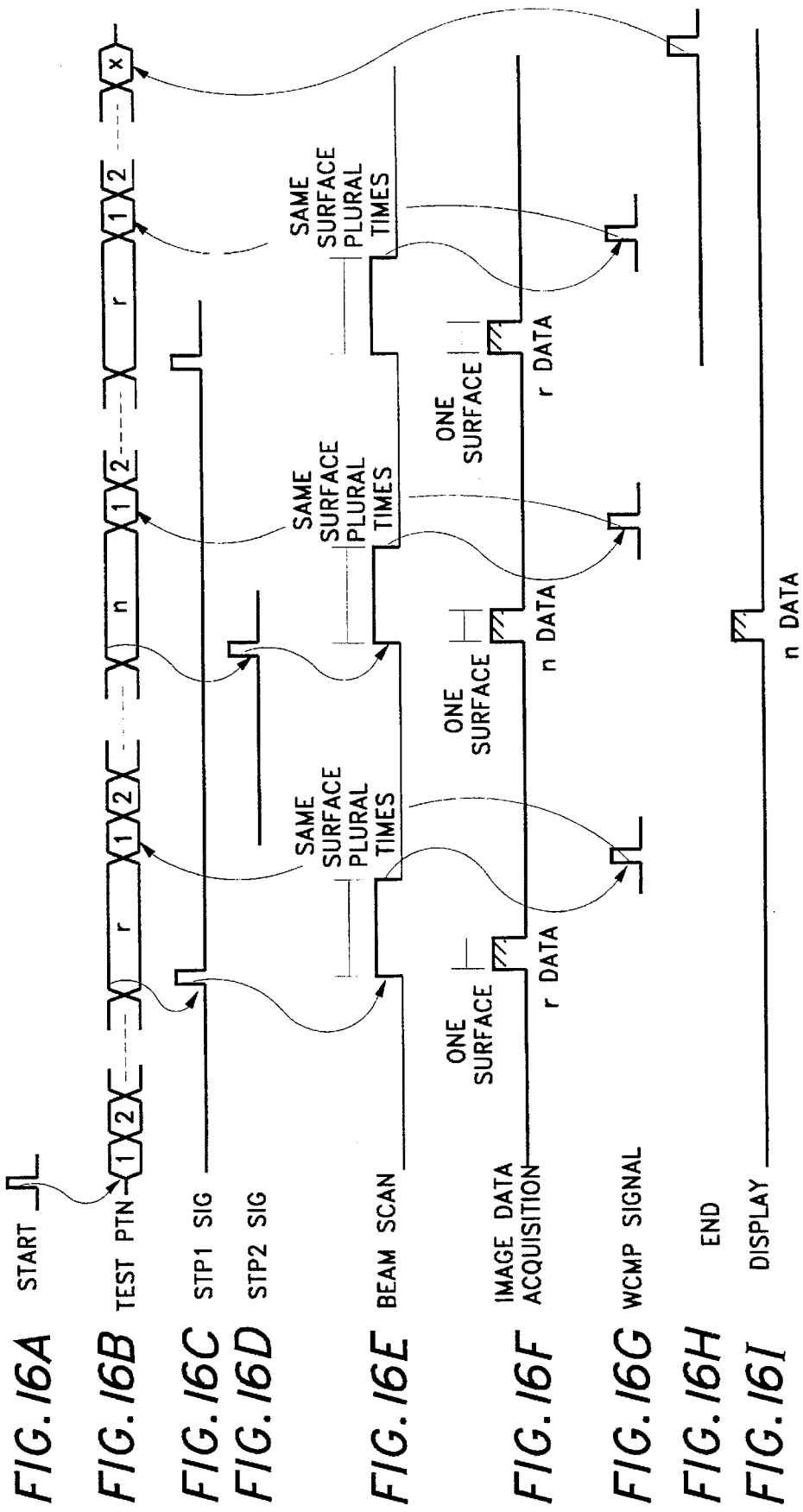

IC ANALYSIS SYSTEM HAVING CHARGED PARTICLE BEAM APPARATUS FOR IMPROVED CONTRAST IMAGE

FIELD OF THE INVENTION

This invention relates to an IC analysis system having a charged particle beam apparatus such as an electron beam tester and an ion beam tester and, more particularly, to a charged particle beam apparatus that irradiates a charged particle beam on an IC under test, measures the quantity of secondary electrons emanating from each irradiated point on the IC and displays the potential distribution of the IC as a potential contrast image for evaluating the IC under test such as locating a faulty position.

BACKGROUND OF THE INVENTION

Heretofore, there has been an IC analysis system of the type that scans and irradiates an IC chip a charged particle beam, measures the quantity of secondary electrons emitted from the IC chip at each irradiated point in terms of an electric signal, and processes the electrical signal to display the potential distribution in the IC chip as a potential contrast image that is available for analyzing a fault in the IC chip.

This assignee disclosed the related technologies in the Japanese Patent Application No. 5-190440 entitled "Electron Beam Tester and IC Analysis System Incorporating Thereof", and in the Japanese Patent Application No. 5-257625 entitled "Method for Locating Faulty Part of IC". Moreover, this assignee disclosed the related technology in the Japanese Patent Application No. 6-101938 entitled "Method for Locating Faulty Part of IC Utilizing Ion Beam Tester and IC Analysis System Incorporating Ion Beam Tester".

The present invention is applicable to all kinds of charged particle beam apparatus including an electron beam tester and an ion beam tester. In the present invention, the term "charged particle beam apparatus" includes both an ion beam tester and an electron beam tester. Moreover, in the context of this invention, the term "charged particle beam" includes both an ion beam and an electron beam.

FIG. 18 shows a general construction of the conventional type IC analysis system. Reference numeral 100 denotes the general view of an IC analysis system, which is made up of a test pattern generator 200 and a charged particle beam apparatus 300. The test pattern generator 200 provides a test pattern signal to an IC under test (which will hereinafter be referred to also as a device under test DUT) placed in the charged particle beam apparatus 300.

The conventional test pattern generator 200 includes; a start switch 201 for starting the generation of the test pattern; a stop switch 202 for stopping the generation of the test pattern at an arbitrary point of time; stop pattern setting means 203 for stopping the updating of the test pattern when a specified test pattern is generated; pattern holding means 204 for stopping the updating of the test pattern by detecting the test pattern set to the stop pattern setting means 203; and stop signal generating means 205 for generating a signal indicating the stop of the updating of the test pattern. Because of this arrangement, the test pattern generator 200 can control a start and stop of the test pattern signal and a stop of the updating of a specific test pattern.

The charged particle beam apparatus 300 is made up of; a column part 301 which irradiates a device under test DUT a charged particle beam; a chamber 302 which is provided just under the column part 301 to hold the device under test DUT in a vacuum; a stage 303 which is provided in the chamber 302 to shift the position of the device under test DUT in the X-Y direction; a sensor 304 for measuring the quantity of secondary electrons from the device under test DUT as an electrical signal; an image data acquiring apparatus 305 which fetches therein, as image data, the electrical signal detected by the sensor 304; a monitor 306 which displays, as a potential contrast image, the image data processed by the image data acquiring apparatus 305; and a column controller 307 which controls the emission of the charged particle beam, the quantity of its emission (an electric current value), an acceleration voltage, a scanning speed, a scanning area, and etc.

When detecting that the test pattern generator 200 has generated a test pattern set in the stop pattern setting means 203, the pattern holding means 204 suspends its test pattern updating operation and maintains the test pattern output at that time. AT the same time, the stop signal generating means 205 supplies the image data acquiring apparatus 305 and the column controller 307 a stop signal representing that the test pattern updating operation has stopped. Upon receiving the stop signal, the column controller 307 effects control to emit the charged particle beam and image data acquiring apparatus 305 begins to fetch therein image data.

The method to specify an IC fault is accomplished by setting a test pattern that causes failure in the device under test DUT in the stop pattern setting means 203. It has already been checked in an IC tester that the test pattern causes failure in the DUT (but not a specific location in the DUT). On detecting that the test pattern generator 200 has generated the test pattern that was set in the stop pattern setting means 203 and that also causes failure, the test pattern generator 200 suspends the test pattern updating operation and maintains the test pattern set in the stop pattern setting means 203. Upon receiving the stop signal, the column controller 307 effects control to emit the charged particle beam and image data acquiring apparatus 305 begins to fetch therein image data. The above procedures up to the fetching the image data in the image data acquiring apparatus 305 are performed for both the normal state and the faulty state of the device under test DUT. The image data acquiring apparatus 305 compares the image data, and then the difference between both image data is identified as a fault.

Conventionally, the time for suspension of the test pattern is set slightly longer than the time for writing the image data in the image data acquiring apparatus 305. As a consequence, a change in the conditions for writing the image data in the image data acquiring apparatus requires the change in the test pattern suspension time as well. Therefore, the prior art IC analysis system has a disadvantage in its operability.

That is, a charged particle beam acceleration voltage, a scanning speed, a scanning area, a scanning time, etc. must be set for capturing image data, and if these conditions are changed or modified, the time for acquiring image data will change. Consequently, when the conditions for capturing image data are changed, the test pattern suspension time also needs to be changed accordingly. This involves operating both of the test pattern generator 200 and the charged particle beam apparatus 300, and hence is troublesome.

On the other hand, the conditions for writing the image data in the image data acquiring apparatus 305 needs to be changed in accordance with the purpose of each test. In particular, in the case where the device under test DUT is an IC chip which is covered all over with an insulating film as a protective layer, it is necessary to observe or measure potentials corresponding to those of wiring conductors underlying the insulating film. It is difficult, however, to detect, as a potential contrast image, the potential distributions of the wiring conductors of the IC chip which is covered with the insulating film.

That is, when the surface of the insulating film is irradiated with a charged particle beam, the potential distribution ultimately disappears owing to the storage of charges on the insulating film in proportion to the charged particle beam emanating time, and as a result, it is impossible to detect a desired potential contrast image. FIG. 19 shows such a situation where the potential distribution of the IC chip surface disappears.

In FIG. 19A, the potential contrast image is illustrated wherein conductors L1, L2, L3 and L4 that are underlying the insulating film and that have been supplied with L-logic, H-logic, L-logic and H-logic potentials, respectively. As shown, the application of the L-logic potential (a voltage close to zero volt or negative potential) provides a white potential contrast image (which means that the quantity of secondary electrons reaching a sensor 304 is large). The application of the H-logic potential (a positive voltage exceeding zero volt) provides a black potential contrast image (which means that the quantity of secondary electrons reaching the sensor 304 is small). In this instance, an insulating substrate PB has an intermediate potential between the L-logic and H-logic potentials and is displayed in gray.

FIGS. 19B and 19C show potential contrast images appearing (in 0.1 to 0.3 seconds) after the scanning irradiation with the charged particle beam. As will be seen from these drawings, when the charged particle beam is applied, the potential contrast rapidly lowers as in FIG. 19B and finally disappears as in FIG. 19C. Thus, necessary image data can be obtained only when the potential contrast is in such a state as shown in FIG. 19A. In other words, it is difficult to obtain a clear image by only a single fetch of image data because the potential contrast can not be held for a long time.

Owing to the presence of such a potential contrast reduction phenomenon, the conditions for acquiring the image data, i.e., the area to be scanned with the charged particle beam, the current value of the charged particle beam, etc., must be changed frequently. However, each time the conditions for acquiring the image data are changed, the time interval for which the updating of the test pattern is suspended must also be reset, which is time consuming and impairs the operability of the system.

In the IC analysis system having the charged particle beam apparatus, the potential contrast image is obtained through the steps of scanning and irradiating one area of the device under test DUT with a charged particle beam, applying thereto a desired test pattern and acquiring the quantity of secondary electrons as image data. In the case of an IC chip of which the surface is covered with an insulating film, however, as noted above, there is the phenomenon that the potential distribution formed on the insulating film disappears in proportion to the quantity of the charged particle beam irradiation as described previously. On this account, only image data acquired under one scanning irradiation with the charged particle beam becomes effective. Moreover, such small quantity of the image data as acquired under one scanning irradiation with the charged particle beam, stored into an image memory, etc. and read out repeatedly, causes a defect that the potential contrast image can not be finely and clearly displayed in a monitor 306.

One possible solution to this problem is to update test patterns one after another and continue the scanning irradiation with the charged particle beam until the specific test pattern n is generated. In this method, since the IC chip is irradiated with the charged particle beam while the test patterns are updated at high speed, the potential of the insulating film covering the surface of the IC chip becomes a mean value of potential variations of the wiring conductors, that is, an intermediate value between the H-logic and the L-logic. When the pattern updating operation stops upon generation of the specified test pattern n, the potential distribution dependent on the test pattern can be captured as a potential contrast image.

After acquiring the image data, by resuming the pattern updating operation and further continuing the scanning irradiation with the charged particle beam, the potential of the insulating film takes again the intermediate value between the H-logic and the L-logic. By repeating this process, the potential contrast image corresponding to the desired test pattern being supplied can be obtained. This increases the quantity of image data, and the picture quality of the voltage contrast image can be enhanced.

However, this method still has disadvantages as mentioned below. That is, according to the potential immediately prior to the suspension of the pattern updating operation upon generation of a desired test pattern, some wiring conductors may be displayed as potential contrast images but other wiring conductors may not, which is not desirable for the fault analysis.

SUMMARY OF THE INVENTION

A primary object of the present invention is to enhance the operability of such an IC analysis system having a charged particle beam apparatus which retains potential contrast image unchanged even in the presence of the potential contrast reduction phenomenon.

A further object of the present invention is to provide an IC analysis system which uses such a charged particle beam apparatus and method for specifying IC faults in a non-contact manner.

A further object of the present invention is to improve the picture quality of the potential contrast image which represents the potential distribution of wiring conductors in an IC chip to which a desired test pattern is being applied and of which the surface is covered with an insulating film.

The first aspect of the present invention is embodied in an improved IC analysis system having a charged particle beam apparatus which is capable of reducing the test time and enhancing operability. The IC analysis system includes: a charged particle beam apparatus which scans and irradiates a charged particle beam on the surface of a device under test, measures the quantity of the secondary electrons from each irradiated point and displays the surface potential distribution of the device under test as an image; and a test pattern generator which supplies test patterns to the device under test.

The test patter generator comprises stop pattern setting means for setting a test pattern to stop the updating of the said test patterns in a test pattern generator; pattern holding means for suspending a test pattern updating operation and for holding the test pattern set by the stop pattern setting means; stop signal generating means for outputting a pattern stop signal to represent that the test pattern updating operation has stopped; and release means for releasing a pattern holding state on receiving an acquisition completion signal that represents the completion of the acquisition of image data provided by the charged particle beam.

Furthermore, the said charged particle beam apparatus comprises image data acquisition means which responds to the pattern stop signal output from the stop signal generating means to start the acquisition of image data; and acquisition completion signal generating means which generates the said acquisition completion signal representing that the image data acquisition means has taken therein required image data.

According to the first aspect of the present invention, once the image data acquisition means captures desired image data, the acquisition completion signal generating means output an acquisition completion signal that represents the completion of the acquisition of image data. The pattern generator starts the test pattern updating operation with this acquisition completion signal. Therefore, it is not necessary to set a test pattern stop or suspension time in the test pattern generator, and the acquisition of the image data and the start and stop of the test pattern can automatically be repeated.

The second aspect of the present invention is embodied in an improved IC analysis system having a charged particle beam apparatus which is capable of improving picture quality by compensating a potential reduction phenomenon. In this invention, at least two test patterns can be set in the stop pattern setting means established in the test pattern generator. Moreover, every time the first and second test pattern are supplied, respectively, the test pattern updating operation is suspended. In addition to this, image data is not captured but only the irradiation of the charged particle beam is performed during the generation of the first test pattern. Moreover, the irradiation of the charged particle beam and the acquisition of the image data are performed during the generation of the second test pattern. The irradiation with the charged particle beam is not performed except for these periods. As a result, the image of the portions where the potential has changed can be more definitely detected under the second test pattern than under the first test pattern.

Therefore, by performing only the irradiation of the charged particle beam at the time when the first test pattern is generated, a potential distribution on the surface of the device under test DUT can be displayed as a potential contrast image in a subsequently period when generating the second test pattern. According this procedure, the potential contrast image can always be obtained in a portion where the potentials corresponding to the first and second test patterns are reverse in polarity.

There are several methods for locating a fault in the device under test by utilizing the IC analysis system of the present invention. In one example, the same test pattern is used as the first and second test pattern and operating conditions of a device under test DUT is altered at the time when each test pattern are applied. In the other method, different patterns are respectively used as the first and second test patterns, and the image data is captured at the time when each test pattern is applied and the difference between the image data is displayed. In another method, the image data is captured only once at the time when the first and second test patterns are applied, and the surface potential of a device under test DUT is maintained in equilibrium through plural times of irradiation for the same portion.

BRIEF DESCRIPTION OF THE DRAWINGS

FIG. 3 is a waveform diagram for explaining the operation of the embodiment of FIG. 1.

FIG. 4 is a waveform diagram for explaining the operation of the embodiment of FIG. 1.

FIG. 15 is a waveform diagram for explaining the operation of the measurement method in the embodiment.

FIG. 16 is a waveform diagram for explaining the operation of the measurement method in the embodiment.

DESCRIPTION OF THE PREFERRED EMBODIMENTS

Figure 1:
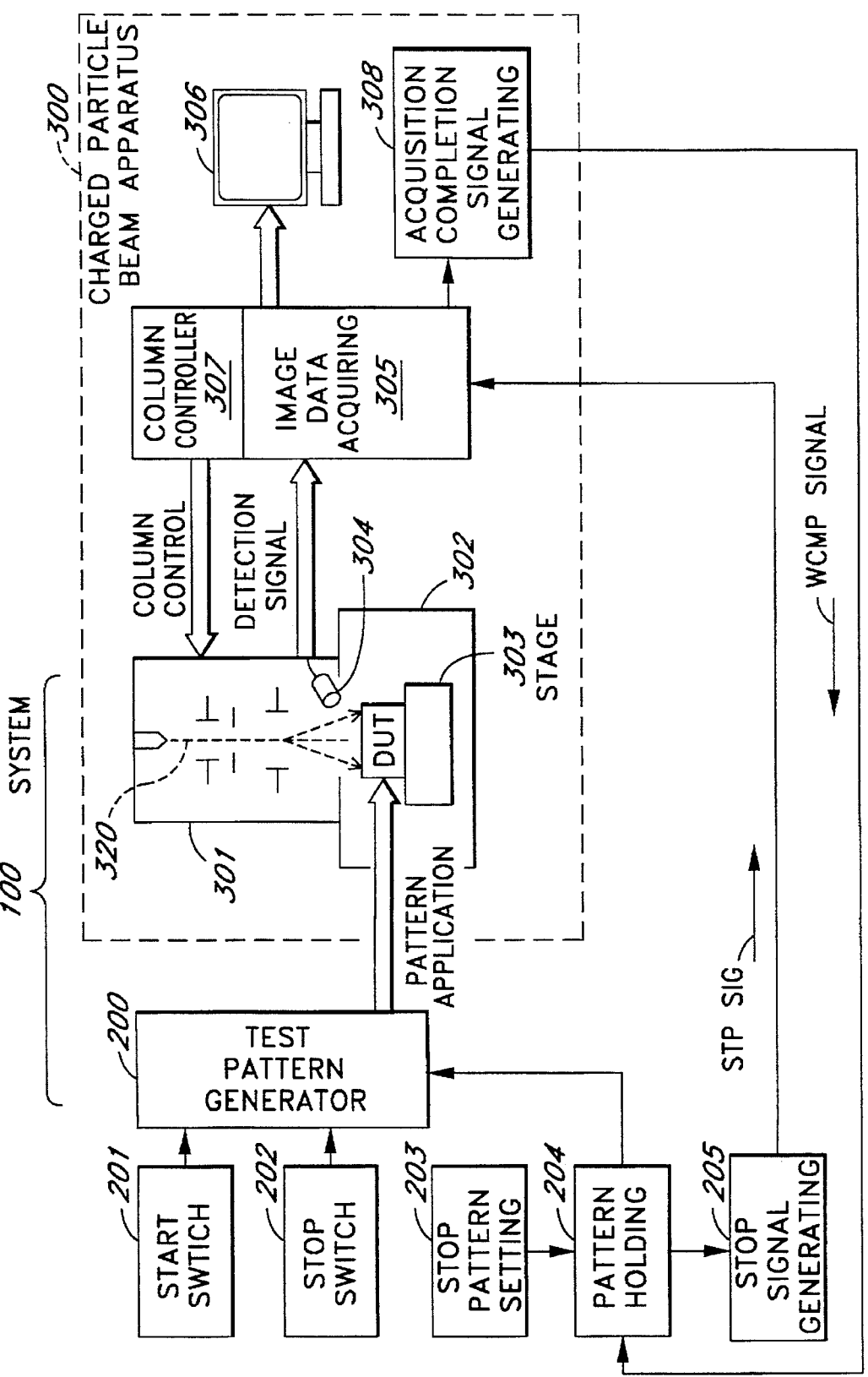
FIG. 1 is a block diagram showing an embodiment of the first aspect of the present invention.
Figure 18:
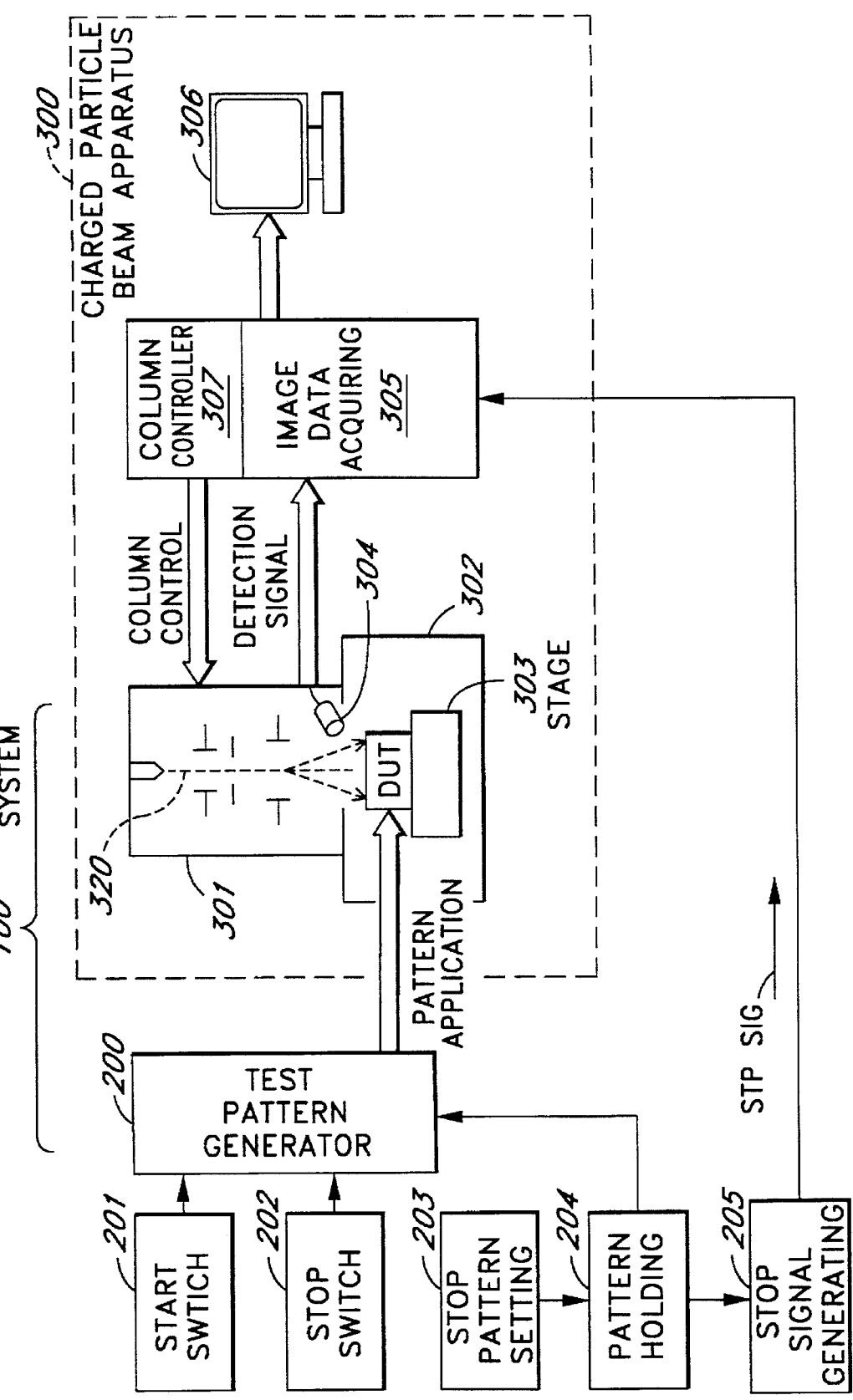
FIG. 18 is a block diagram showing a structure of the conventional IC analysis system.
Figure 19A:
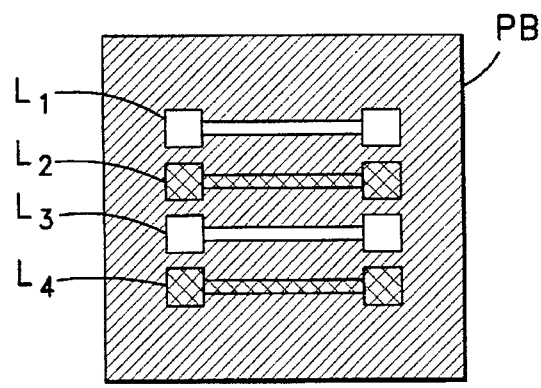
FIG. 19A to 19C are graphic views of the potential contrast in the conventional IC analysis system of FIG. 18.
Figure 19B:
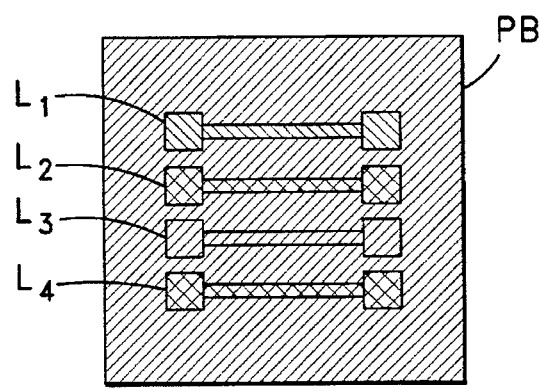
Figure 19C:
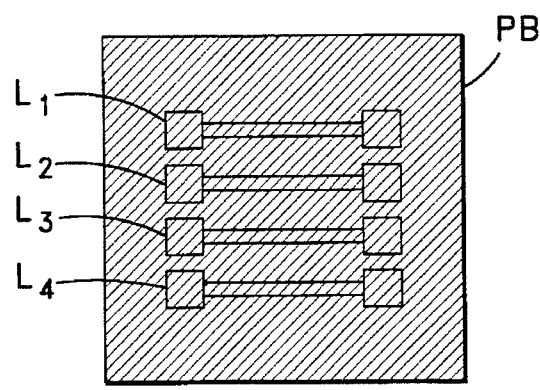

FIG. 1 shows a block diagram of an embodiment of the first aspect of the present invention. In FIG. 1, the parts corresponding to those in FIG. 18 are designated by the same reference numerals. One of the inventive features of this IC analysis system is that an acquisition completion signal generating 308 is provided in the charged particle beam apparatus 300. This acquisition completion signal generating means 308 generates an acquisition completion signal when detecting that the image data acquiring apparatus 305 has completed the acquisition of image data. The acquisition completion signal is input into the pattern hold means 204 of the test pattern generator 200.

When supplied with the acquisition signal, the pattern holding means 204 provides a command to the test pattern generator 200 to cancel the suspension of its test pattern updating operation. Then, the test pattern generator 200 is released from the stopped state and resumes the test pattern updating operation. That is, according to the present invention, assuming that a stop pattern n, for example, is set in the stop pattern setting means 203, the pattern holding means 204 responds to each generation of the stop pattern n to stop the test pattern updating operation of the test pattern generator 200 and hold it in the state of outputting the test pattern n.

Figures 2A, 2B, 2C, 2D, 2E:
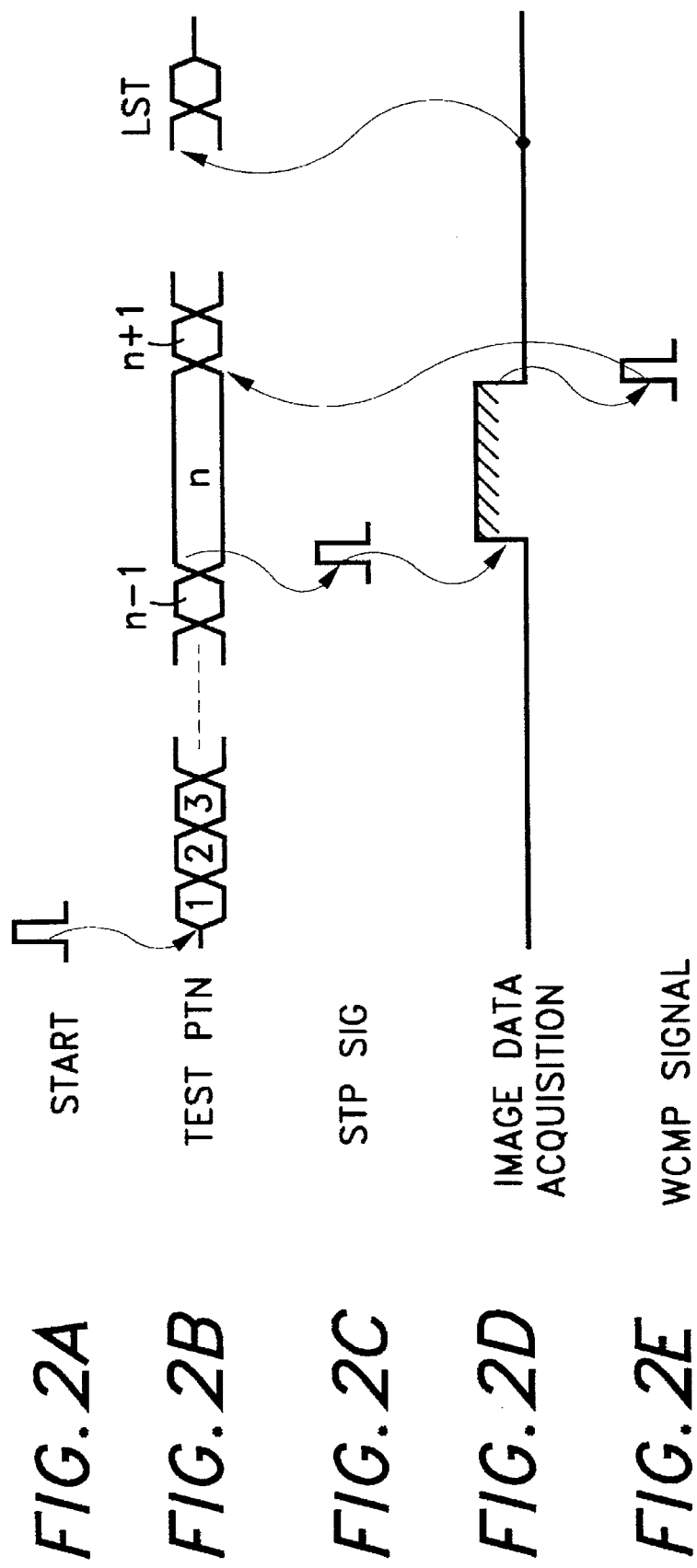
FIG. 2 is a waveform diagram for explaining the operation of the embodiment of FIG. 1.

FIG. 2 is a waveform chart showing an operational procedure. A start signal in FIG. 2Aa initiates the test pattern shown in FIG. 2B. When the test pattern reaches data n (which indicates an address generally representing the order of pattern generation), the pattern holding means 204 causes the test pattern generator 200 to stop its pattern updating operation and hold it in the state of outputting the pattern data n, while at the same time the stop signal generating means 205 outputs the stop signal (FIG. 2C). The stop signal is applied to the image data acquiring apparatus 305 to cause it to start the acquisition of the image data for a predetermined period (FIG. 2D).

The completion of the acquisition of image data can be known. For example, by detecting a vertical blanking signal representing that the scanning irradiation with the charged particle beam has been executed for one frame. By generating the acquisition completion signal when detecting one or desired number of vertical blanking signals, it is possible to generate the acquisition completion signal when the charged particle beam has scanned one or desired numbers of frames. FIG. 2E shows the acquisition completion signal which is triggered by the end of the acquisition.

When the acquisition completion signal is applied to the pattern holding means 204, the test pattern signal generator 200 is released from the stopped state and generates test patterns n+1, n+2, ... and outputs a last pattern LST as shown in FIG. 2B. In such a setting as a series of test patterns is generated at a single time, the test pattern generator 200 stops after generating the last pattern LST.

In the case where the test pattern generator 200 is set to repeat the generation of a series of test patterns, it automatically stops upon each generation of the test pattern n, restarts after the completion of the last pattern LST, thereafter repeating the generation of the patterns, as shown in FIG. 3. Alternatively, after acquiring the image data, it is also possible to go back to the first pattern as shown in FIG. 4. At any rate, the image data in the state of the specified test pattern n being applied can be automatically acquired a plurality of times. The pattern generator 200 can be stopped by the stop switch 202.

As mentioned above, the start and stop operations of the test pattern generator 200 are associated with the image data acquiring operation of the charged particle beam apparatus 300 by the stop pattern setting means 203 whereby a test pattern is set. Hence, even if the conditions for acquiring the image data are changed, the setting of the test pattern generator 200 does not have to be changed. Accordingly, the overall operation can be simplified, less time consuming and the operability can be enhanced.

Figure 5:
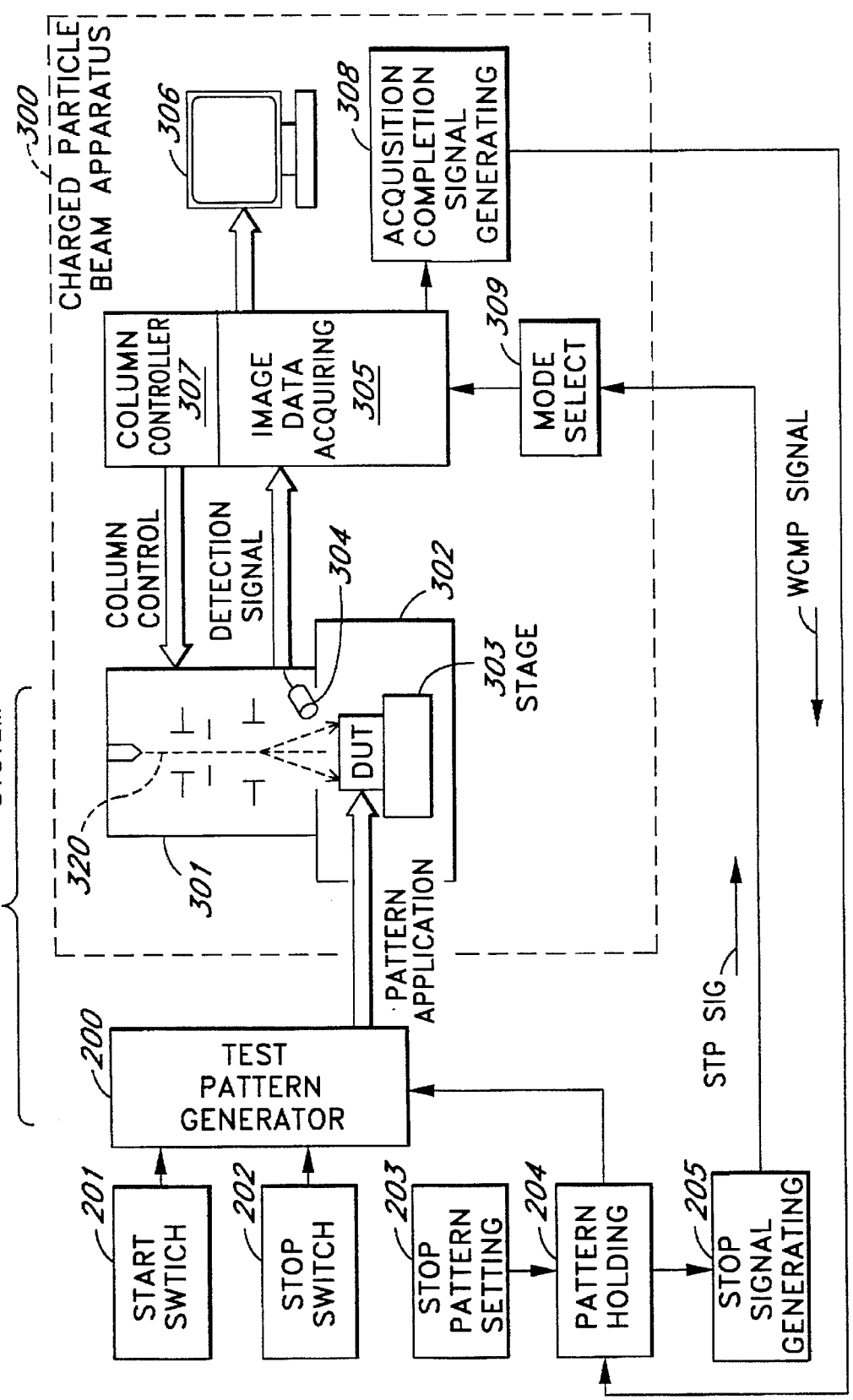
FIG. 5 is a block diagram showing an embodiment of the second aspect of the present invention.

The second aspect of the present invention is to enhance an ability for acquiring the image data through the use of the IC analysis system proposed in the first invention. FIG. 5 shows a block diagram of the preferred embodiment of the second invention. In the second invention, the stop pattern setting means 203 where the first test pattern r and the second test pattern n can be set is adapted and mode select means 309 is provided in the charged particle beam apparatus 300. The mode select means 309 effects control of switching between the first operation mode which causes the column controller 307 to perform the scanning irradiation with the charged particle beam and the image data acquiring B apparatus 305 not to capture image data, when the test pattern generator 200 stops the test pattern updating operation according to the generation of the first test pattern 4, and the second mode which starts both the column controller 307 and image data acquiring apparatus 305, when the test pattern generator 200 stops the test pattern updating operation according to the generation of the second test pattern n.

Figure 6:
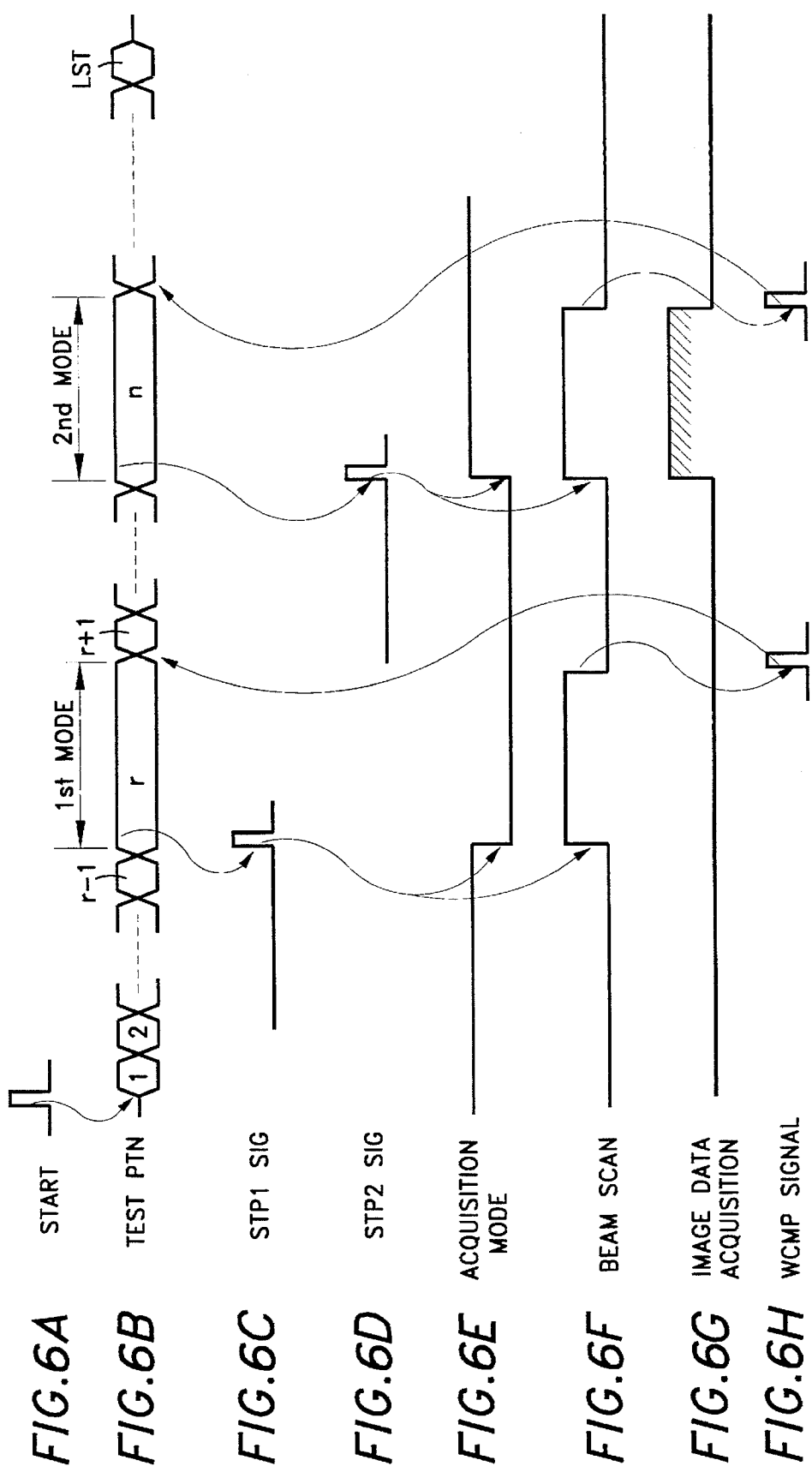
FIG. 6 is a waveform diagram for explaining the operation of the embodiment of FIG. 5.
Figure 7:
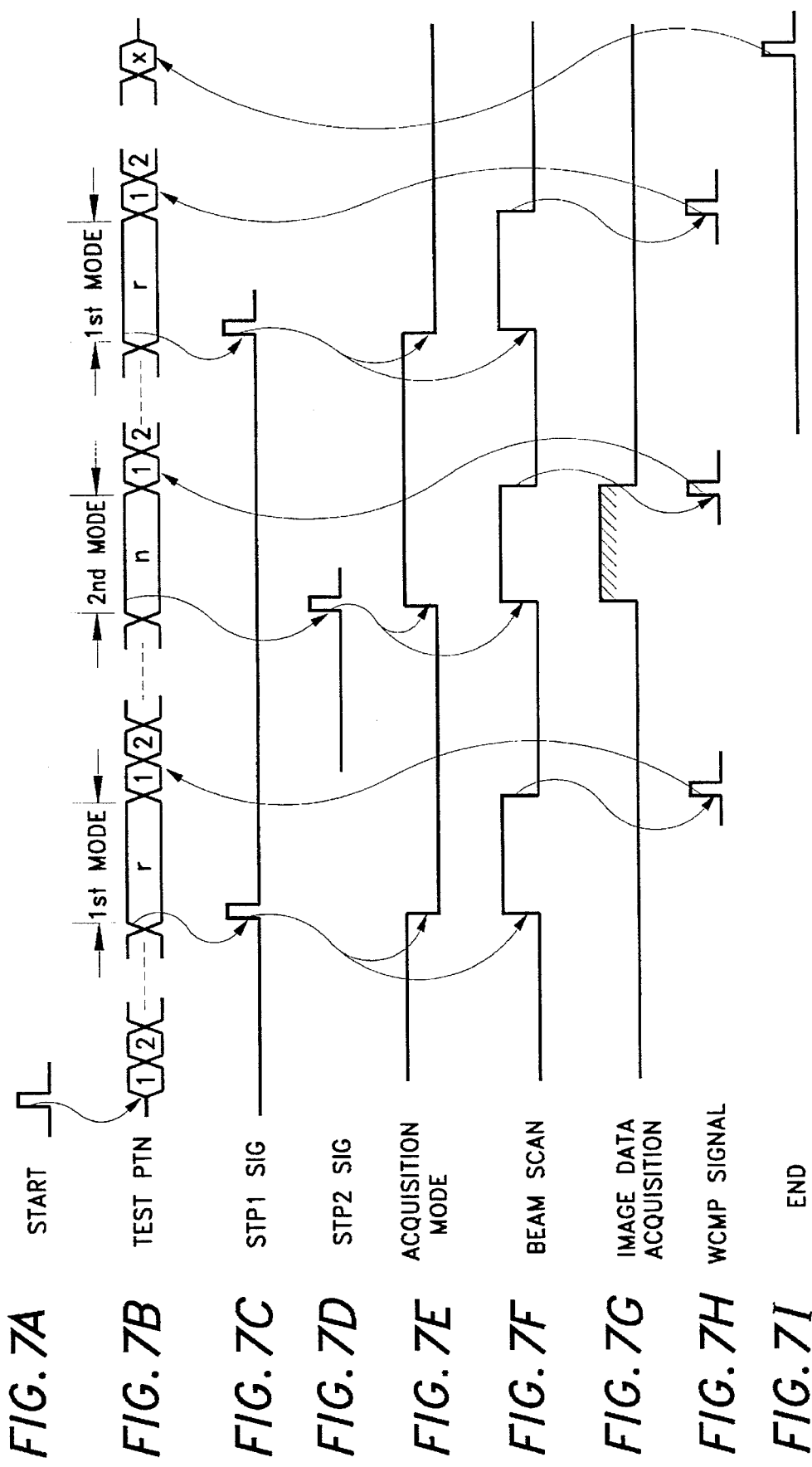
FIG. 7 is a waveform diagram for explaining the operation of the embodiment of FIG. 5.

FIGS. 6 and 7 show the states of the first and second operation modes as above. FIG. 6 shows the case of generating the test pattern continuously from the leading address to the last address LST. FIG. 7 shows the case of returning the operation to the leading address upon each execution of the first and second operation modes. By acquiring the image data in the second operation mode after the first operation mode, it is possible to eliminate the influence of potential contrast reduction on the surface (the insulating film) of the device under test DUT.

That is, by irradiating the charged particle beam on the device under test DUT in the first operation mode, the surface potential of the device under test DUT has a potential contrast determined by the test pattern applied thereto. By generating the test pattern n while applying this potential contrast, a potential contrast image is repeatedly formed only in a portion where there is a wiring conductor which is supplied with a potential of a different polarity when the test patterns r and n are applied, respectively. Thus, the potential contrast image are accumulated, and hence a clear potential contrast image can be obtained.

Figure 8:
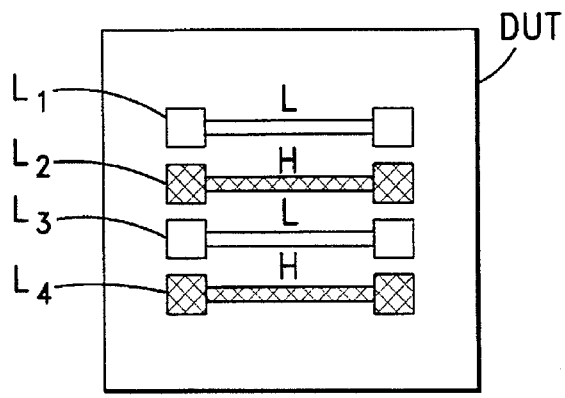
FIG. 8 is a plan view of the device under test for explaining the potential of wiring in a device under test to which the test pattern r has been applied.

This effect is described in more detail with reference to the examples in FIGS. 8, 9, 11 and 14 below. FIG. 8 shows potential differences that are applied to the conductors L1, L2, L3 and L4 when the first test pattern r is applied. The example of FIG. 8 shows the state of applying L-logic to the conductor L1, H-logic to the conductor L2, L-logic to the conductor L3, H-logic to the conductor L4.

Figure 9:
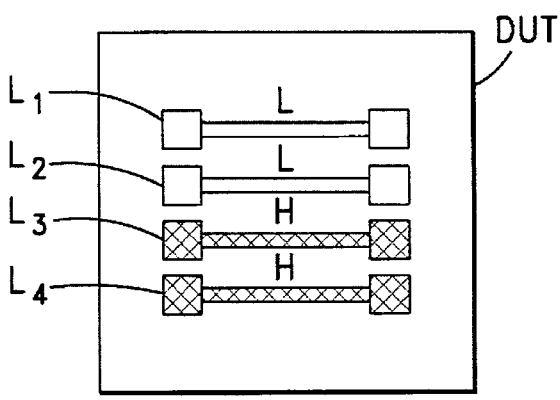
FIG. 9 is a plan view of the device under test for explaining the potential of wiring in a device under test to which the test pattern n has been applied.

FIG. 9 shows potential differences that are applied to the conductors L1 through L4 when the second test pattern n is applied. The example of FIG. 9 shows the state of applying L-logic to the conductors L1 and L2 and H-logic to the conductors L3 and L4.

Figure 11:
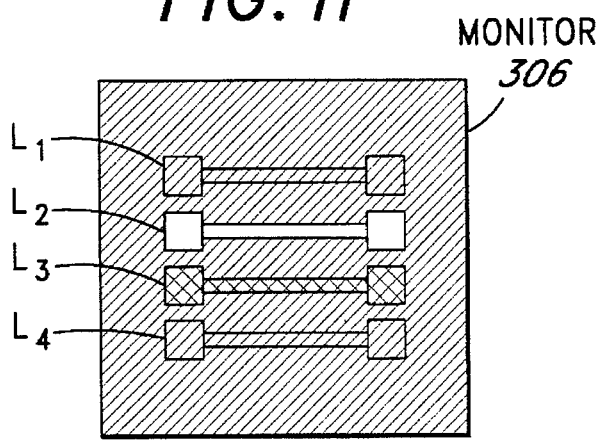
FIG. 11 is a graphic display on the monitor screen showing a potential contrast image in a state of applying the test pattern n after the alternate applications of the test patterns r and n.

By the following steps of scanning and irradiating the charged particle beam on the area containing the conductor L1 through L4 under the state of FIG. 8, and also scanning and irradiating the charged particle beam on the same area under the state of FIG. 9, and then acquiring the image data at that time, it is possible to obtain such a potential contrast image as shown in FIG. 11. As will be seen from the potential contrast image shown in FIG. 11, only conductors supplied with potentials which are reversed in the polarity alternately by the application of the first and second test patterns r and n appear as potential contrast images. In this example, the conductors L2 and L3 are displayed as potential contrast images, whereas the conductors L1 and L4 are each supplied with the same potential, and hence are not displayed as potential contrast images.

The reason for the above effect will be given with reference to FIG. 14. Since the first test pattern r supplies the conductors L1 and L3 the L-logic potential, the potentials of insulating film covering these conductors L1 and L3 are biased negatively in excess of an equilibrium potential Vs (equivalent to the potential of the surrounding insulator) indicated by the broken lines. Furthermore, since the conductors L2 and L4 are supplied with the H-logic potential, the potential of the insulating film covering these conductor L2 and L4 are biased positively in excess of the equilibrium potential Vs (FIGS. 14B–14E).

When scanning and irradiating the charged particle beam on device under test DUT in this state, the potentials of the insulating film gradually vary toward the equilibrium potential Vs. During the irradiation of the charged particle beam, the potential of the insulating film undergoes a change, but when the irradiation is stopped, the potential change will also be stopped. Although several test patterns are applied in the interval between the first and second test patterns r and n, the potentials Va, Vb, Vc and Vd (FIGS. 14B–14E) changed through the scanning irradiation with the charged particle beam are held during the period when the irradiation is stopped.

Figure 14A:
FIG. 14 is a waveform diagram for explaining the reason for disappearance of the potential contrast of a portion at which the same polarity is given when the test patterns r and n are alternately applied.
Figure 14B:
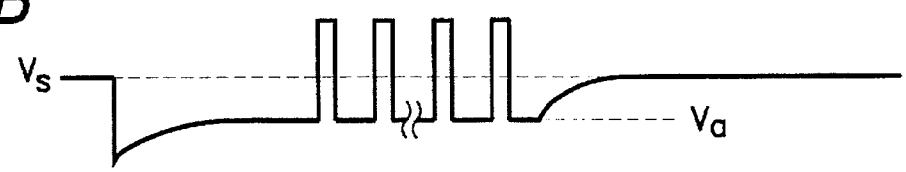
Figure 14C:
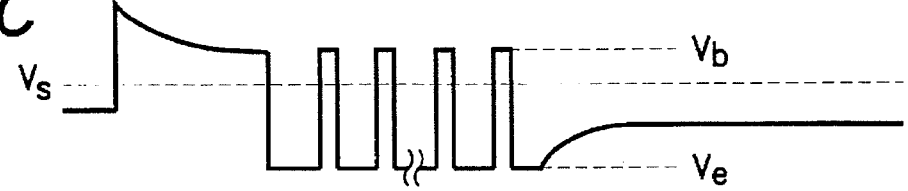
Figure 14D:
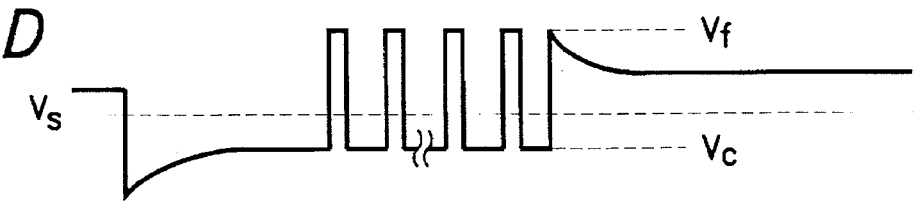

Only when the conductors L1 through 14 are applied with the reverse polarity of the potentials during the step where the second test pattern n is applied and the irradiation of the charged particle beam is resumed, the potentials of those conductors start to vary from the potentials Ve and Vf far from the equilibrium potential Vs as shown in FIGS. 14C and 14D. The potentials of the conductors supplied with the same polarity as the previous step, however, start to vary from the potential Va and Vd closer to the equilibrium potential Vs as in FIGS. 14B and 14E.

Hence, in this example where the test pattern n is applied and where the potentials of the same polarity as before are provided, the potentials of the insulating film of the conductors L1 and L4 start to vary from the value close to the equilibrium potential Vs. Consequently, since the potentials close to the equilibrium potential Vs shift to the state of equilibrium in a short period of time, the potential contrast image can hardly be obtained. On the contrary, since the potentials of the conductors L2 and L3 are supplied with the reverse logic potential, the conductor potentials start to vary from the potentials Ve and Vf far from the equilibrium potential Vs. Therefore, the clear potential image can be obtained.

As described above, according to the second aspect of the present invention, by applying the second test pattern n after the first test pattern r, it is possible to obtain, at all times, a potential contrast image of the conductor which is supplied with the second test pattern n having the opposite polarity of potential to the potential in the first test pattern r.

Hence, by acquiring this potential contrast image as image data, the image data can be accumulated. Moreover, a clear potential contrast image of improved S/N (signal to noise) ratio can be obtained by averaging the image data. By changing the first test pattern r to new ones in a sequential order, the conductor of the device under test DUT whose logic is reversed at the time of applying the test pattern n can be produced one after another. This enables observation of the conditions of almost all the conductors in the device under test DUT.

In the following, the fault locating method in the present invention will be described. According to the first locating method, faults are discovered through steps of using the same pattern n as the first and second patterns in the apparatus of the present invention and using the different operating condition of the device under test DUT in applying each test pattern. That is, the first test pattern is n and the second test pattern is also n. In applying the first test pattern n, an operating voltage, for example 3 V, which is substantially different from the prescribed voltage range of 4.5 V to 5.0 V is applied. Then, in applying the second test pattern n, the prescribed voltage 5 V is applied.

In this situation, if the operation of the device under test DUT is normal on the application of the first and second test patterns n, the potential contrast image can not be obtained. On the contrary, if an unusual operation occurs on the application of either the first test pattern n or the second test pattern n, conductors to which the applied voltage polarity is reversed will appear and the potential contrast image for that conductors can be obtained. Accordingly, the potential contrast image indicates the portions where the unusual operation occurs in the DUT. This is effective for the rapid failure analysis of semiconductor devices, for example, margin failure analysis.

Moreover, there is also a method for measuring failure location by changing the clock rate of the test pattern with the constant voltage. In this second method, for example, the first test pattern is set to the standard frequency 10 MHz and the second test pattern is set to 15 MHz. If failure occurs at either of the frequencies, the potential contrast can be obtained and the failure analysis of, for example, the margin failure is rapidly accomplished. This procedure includes the steps of storing the reverse logic of image data acquired on application of the test pattern r, adding image data acquired on application of the test pattern n to the image data obtain in the first test pattern, and displaying the added result as a potential image on a monitor 300. This second method can also produce a clear potential contrast image.

The reason for this clear potential contrast image in the second method will be described with reference to FIGS. 8–14. FIG. 8 shows potential differences produced in the wiring conductors L1, L2, L3 and L4 of the device under test DUT in the case where the test pattern r is supplied. In other words, FIG. 8 shows the state of applying L-logic to the conductor L1, H-logic to the conductor L2, L-logic to the conductor L3 and H-logic to the conductor L4. FIG. 9 shows potentials produced in the corresponding wiring conductors L1 through L4 in the case where the test pattern n is supplied. In other words, FIG. 9 shows the state of applying L-logic to the conductors L1 and L2 and H-logic to the conductors L3 and L4.

Figure 10:
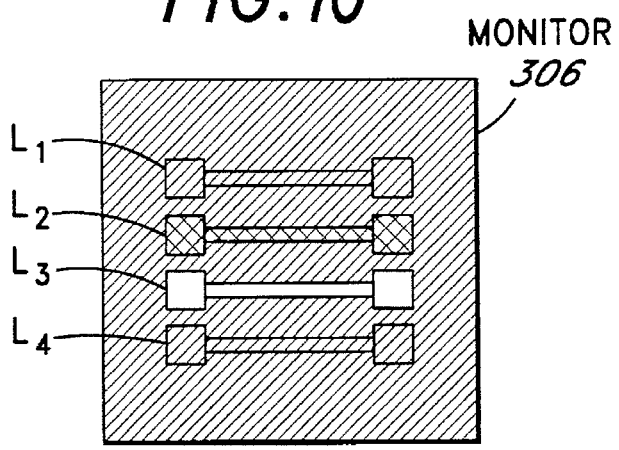
FIG. 10 is a graphic display on a monitor screen showing a potential contrast image under applying the test pattern r after the alternate application of the test patterns r and n.

FIGS. 10 and 11 show these potential contrast images corresponding to FIGS. 8 and 9. FIG. 10 shows the potential contrast image in the case where the test pattern r is supplied and FIG. 11 shows the potential contrast image in the case where the test pattern n is supplied. In FIG. 10, the potential contrast of the conductors L1 and L4 is faded away and the potential contrast of only conductors L2 and L3 remains. In FIG. 11, the potential contrast of the conductors L1 and L4 is faded away and the potential contrast of the conductors of L2 and L3 remains. This is because each of the potentials in the conductors L1 and L4 on application of the test pattern r is the same as that on application of the test pattern n.

FIG. 14 shows the state where the potential contrast is fading. FIG. 14A shows a period when the test patterns r and n are supplied and when the charged particle beam is emitted. FIG. 14B shows the potential contrast of the insulting film covering the surface of the conductor L1. FIG. 14C shows the potential contrast of the insulating film covering the surface of the conductor L2. FIG. 14D shows the potential contrast of the insulating film covering the surface of the conductor L3. FIG. 14E shows the potential contrast of the insulating film covering the surface of the conductor L4.

Figure 14E:
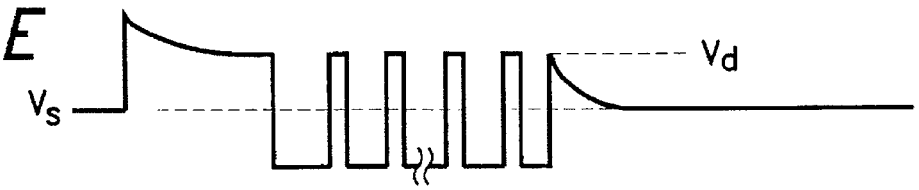
Figure 17A:
FIG. 17 is a waveform diagram for explaining the reason for disappearance of the potential contrast of a portion at which the same polarity is given when the test patterns r and n are alternately applied.
Figure 17B:
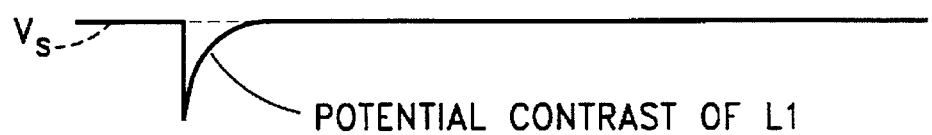
Figure 17C:
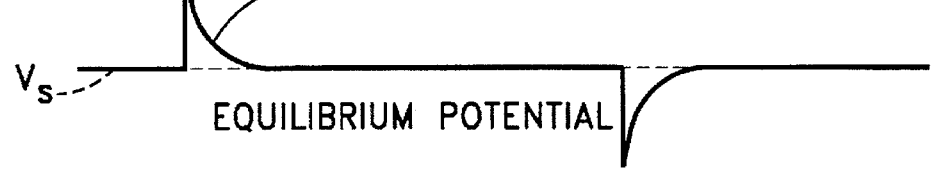
Figure 17D:
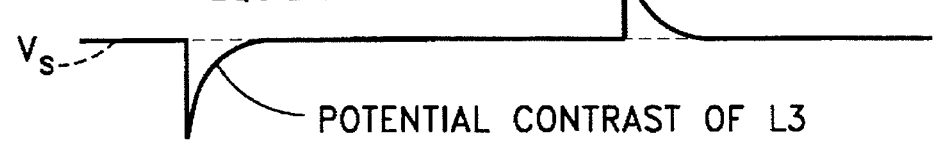
Figure 17E:

As shown in FIGS. 14B and 14E, the potential contrast is produced at the time when the test pattern r is supplied. The potential contrast, however, fades when the charged particle beam is given because the same polarity of potential is applied during the application of the second test pattern n, and then it finally converges on the equilibrium potential Vs.

Thereafter, even if the test patterns r and n are supplied alternately, the potential contrast of the insulating film covering the conductors L1 and L4 will not be produced.

On the contrary, each time when the test patterns r and n are supplied, the potentials of opposite polarity are produced in the insulating film covering the conductors L2 and L3. Therefore, the reversed potential contrasts are produced, respectively at each time when the test patterns r and n are supplied.

Figure 12:
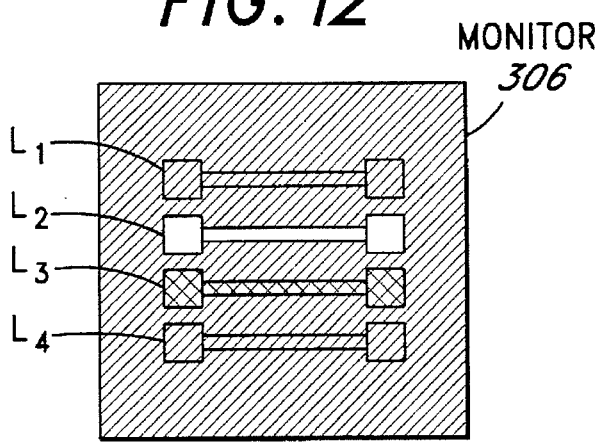
FIG. 12 is a graphic display on the monitor screen showing a reversed potential contrast image of FIG. 10.
Figure 13:
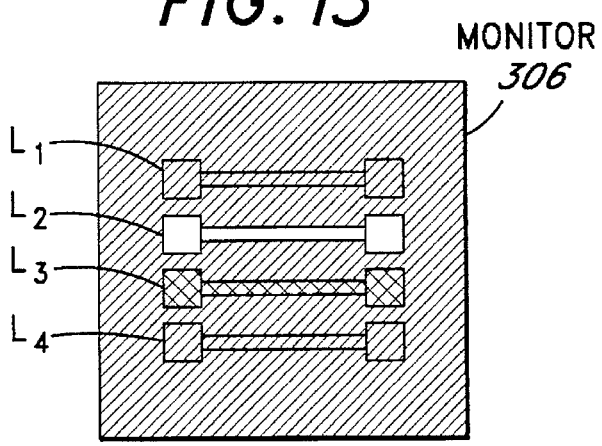
FIG. 13 is a graphic display on the monitor screen showing the computed result of the embodiment as a potential contrast.

FIG. 12 shows image data obtained by reversing the polarity of the image data (the potential contrast) of FIG. 10 acquired when the first test pattern is supplied. Image data shown in FIG. 13 can be obtained by adding the image data shown in FIG. 12 to the image data shown in FIG. 11. The potential contrast of the conductors L2 and L3 is added and emphasized in the image data shown in FIG. 13. As the result, picture quality is enhanced and the potential contrast can be obtained with high resolution.

As described above, if the reverse polarity potential is provided at each time of supplying the test patterns r and n, the reverse potential contrast appears for the surface of the insulating film. Furthermore, in this embodiment, adding the reverse logic data under one test pattern to the image data under another test pattern causes the potential contrast to be emphasized and the picture quality to be enhanced, which makes the potential contrast image clearer, higher contrast and with high resolution.

The third method for locating the fault position in the device under test DUT invention includes the steps of acquiring the first image data on application of each of the first and second test patterns r and n, and then scanning and irradiating the same surface the charged particle beam at plural times. FIGS. 15 and 16 show such procedures of this method.

FIG. 17 shows the state where the potential contrast fades away in this embodiment. As shown in FIGS. 17B and 17E, the potential contrast appears first on supplying the first test pattern, and then converges on the equilibrium potential Vs through plural scanning and irradiations of the charged particle beam. Even if the first and second test patterns r and n are supplied alternately after that, the potential contrast will not be produced for the insulating film existing on the surface of the conductors L1 and L4 because the same polarity voltage is applied to the conductors L1 and L4.

On the contrary, the potential contrast and the reverse polarity potential contrast appears alternately for the insulating film covering the conductors L2 and L3 even when the first and second test pattern r and n are supplied.

In this method, the potential of each portion reaches the state of equilibrium potential because the scanning irradiation of the charged particle beam is executed for the same surface at plural times. In the conductors L2 and L3 where the potential variation occurs, large displacement relative to the equilibrium potential occurs. As a result, the potential contrast is emphasized and the potential contrast image with high resolution can be obtained. As described above, in this invention, when compared with the conventional apparatus, the establishment of the acquisition completion signal generating means causes the operability to be enhanced very much and enables an automatic operation of the system. Next, the establishment of the mode select means enables to choose various manners of the charged particle beam irradiation method and image data acquiring method in which plural test patterns are applied.

Moreover, new measuring methods make the potential contrast clear and enable to display an abnormal operation state of the device under test as the potential contrast. Accordingly, the methods of the present invention have advantages in specifying failure portions rapidly and directly and strengthen the failure analysis of the device under test such as margin failure analysis.

What is claimed is:

1. An integrated circuit (IC) analysis system (100), comprising:

an ion beam tester (300) which irradiates and scans an ion beam on the surface of a device under test, measures the amount of secondary electrons at each irradiated point, and displays the surface potential distribution of said device under test as an image;

a test pattern generator (200) which sequentially updates and applies test patterns to said device under test;

stop pattern setting means (203) for setting at least two stop patterns of a first test pattern and a second test pattern to suspend test pattern updating operations of said test pattern generator (200);

pattern holding means (204) for suspending test pattern updating operations while keeping said test pattern generator (200) generating said first or second test pattern set by said stop pattern setting means (203), and resuming test pattern updating operations when receiving from said ion beam tester (300) an acquisition completion signal representing the completion of acquisition of image data;

stop signal generating means (205) for generating a stop signal representing the suspension of test pattern updating operations;

image data acquisition means (305) in said ion beam tester (300) for responding said stop signal from said stop signal generating means (205) to resume acquisition of said image data; and mode select means (309) in said ion beam tester (300) for executing either a first mode operation in which, when said first test pattern is generated and test pattern updating operations are suspended, said device under test is irradiated with an ion beam scanning, but acquisition of image data is prohibited, or a second mode operation in which, when said second test pattern is generated and test pattern updating operations are suspended, said device under test is irradiated with an ion beam scanning, and acquisition of image data is performed.

2. An IC analysis system (100) according to claim 1, wherein said ion beam tester (300) includes acquisition completion signal generating means (308) which generates said acquisition completion signal representing that said image data acquisition means (305) has completed acquisition of said image data, and wherein said pattern holding means (204) controls said test pattern generator (200) to resume said test pattern updating operations in response to said acquisition completion signal from said ion beam tester (300).

3. An ion beam tester (300) which irradiates a scanning ion beam on the surface of a device under test, said device under test being applied with sequentially updated and generated test patterns from a test pattern generator (200), said ion beam tester (300) measures the amount of secondary electrons at each irradiated point and displays the surface potential distribution of said device under test as an image, said ion beam tester comprising:

image data acquisition means (305) for responding to a stop signal from said test pattern generator (200) to resume acquisition of image data;

mode select means (309) for executing either a first mode operation in which, when said first test pattern is generated and test pattern updating operations are suspended, said device under test is irradiated with an ion beam scanning, but acquisition of image data is prohibited, or a second mode operation in which, when said second test pattern is generated and test pattern updating operations are suspended, said device under test is irradiated with an ion beam scanning, and acquisition of image data performed.

4. An ion beam tester (300) according to claim 3, said ion beam tester further includes acquisition completion signal generating means (308) which generates an acquisition completion signal representing that said image data acquisition means (305) has completed acquisition of said image data, and provides said acquisition completion signal to said test pattern generator (200).

5. A fault isolation method used in an IC analysis system (100) composed of a charged particle beam apparatus (300) which irradiates a charged particle beam scanning on the surface of a device under test, measures the amount of secondary electrons at each irradiated point, and displays the surface potential distribution of said device under test as an image, a test pattern generator (200) which sequentially updates and applies test patterns to said device under test, and stop pattern setting means (203) in which stop patterns of a first test pattern and a second test pattern can be set, said method comprising the steps of:

setting the same pattern n as said first and second test patterns, and setting different operation conditions between said first and second test patterns for said device under test, said different operation conditions including voltage or frequency differences between said first and second test patterns;

performing irradiation with a charged particle beam scanning without performing acquisition of image data when said first test pattern n is generated;

performing both irradiation with a charged particle beam scanning and acquisition of image data when said second test pattern n is generated;

displaying said surface potential contrast image of said device under test.

6. A fault isolation method used in an IC analysis system (100) composed of a charged particle beam apparatus (300) which irradiates the surface of a device under test a charge particle beam scanning, measures the amount of secondary electrons at each irradiated point, and displays the surface potential distribution of said device under test as an image, a test pattern generator (200) which sequentially updates and applies test patterns to said device under test, and has stop pattern setting means (203) in which two stop patterns of a first test pattern and a second test pattern can be set, said method comprising the steps of:

setting pattern r as said first test pattern and pattern n as said second test pattern, said second test pattern having opposite potentials to that of said first test pattern with respect to circuit components in said device under test;

performing both irradiation with a charged particle beam scanning and acquisition of image data when said first test pattern r is generated;

performing both irradiation with a charged particle beam scanning and acquisition of image data when said second test pattern n is generated;

calculating the difference between the image data acquired when said first test pattern r is provided to said device under test and said second test pattern n is provided to said device under test;

displaying said surface potential contrast image of said device under test.

7. A fault isolation method used in an IC analysis system (100) composed of a charged particle beam apparatus (300) which irradiates the surface of a device under test a charge particle beam scanning, measures the amount of secondary electrons at each irradiated point, and displays the surface potential distribution of said device under test as an image, a test pattern generator (200) which sequentially updates and applies test patterns to said device under test, and has stop pattern setting means (203) in which two stop patterns of a first test pattern and a second test pattern can be set, comprising the steps of:

setting pattern r as said first test pattern and pattern n as said second test pattern, said second test pattern having opposite potentials to that of said first test pattern with respect to circuit components in said device under test;

irradiating an area of said device under test displayed on a monitor two or more times with a charged particle beam scanning when said first test pattern r is applied to said device under test;

irradiating the area displayed on said monitor two or more times with a charged particle beam scanning when said second test pattern n is is applied to said device under test;

acquiring only one image data when irradiating said charged particle beam scanning on said device under test during said application of either said first test pattern r or said second test pattern n to said device under test; and displaying said surface potential contrast image of said device under test based on said one image data.

8. A fault isolation method according to claims 5, 6, or 7, wherein said charged particle beam (300) is an ion beam tester.

9. A fault isolation method according to claims 5, 6, or 7, wherein said charged particle beam apparatus (300) is an electron beam tester.

* * * * *